(12) United States Patent
Lecourtier

(10) Patent No.: US 10,015,911 B2
(45) Date of Patent: Jul. 3, 2018

(54) COOLING SYSTEM, COOLED COMPUTER SYSTEM AND COMPUTER FACILITY

(71) Applicant: Bull SAS, Les Clayes-sous-Bois (FR)

(72) Inventor: Georges Lecourtier, Versailles (FR)

(73) Assignee: BULL SAS, Les Clayes-sous-Bois (FR)

( * ) Notice: Subject to any disclaimer, the term of this patent is extended or adjusted under 35 U.S.C. 154(b) by 889 days.

(21) Appl. No.: 14/291,842

(22) Filed: May 30, 2014

(65) Prior Publication Data

US 2014/0355202 A1 Dec. 4, 2014

(30) Foreign Application Priority Data

May 30, 2013 (FR) ...................................... 13 54943

(51) Int. Cl.
*H05K 7/20* (2006.01)
*F28D 15/02* (2006.01)

(52) U.S. Cl.
CPC ......... *H05K 7/20781* (2013.01); *F28D 15/02* (2013.01); *H05K 7/2079* (2013.01); *H05K 7/20736* (2013.01); *H05K 7/20772* (2013.01); *H05K 7/20818* (2013.01); *H05K 7/20836* (2013.01)

(58) Field of Classification Search
CPC ........... H05K 7/20736; H05K 7/20772; H05K 7/20781; H05K 7/2079; H05K 7/20818; H05K 7/20836; F28D 15/02
See application file for complete search history.

(56) References Cited

U.S. PATENT DOCUMENTS

| | | | | |
|---|---|---|---|---|
| 7,165,412 B1* | 1/2007 | Bean, Jr. | ............... | F25B 25/005 165/80.4 |
| 7,791,882 B2* | 9/2010 | Chu | .................... | H05K 7/20745 165/104.33 |
| 8,120,916 B2* | 2/2012 | Schmidt | .................... | G06F 1/20 165/104.33 |
| 8,223,495 B1* | 7/2012 | Carlson | ................. | F24F 5/0035 165/104.33 |
| 9,282,684 B2* | 3/2016 | Keisling | ............ | H05K 7/20827 |
| 9,326,430 B2* | 4/2016 | Neumann | .......... | H05K 7/20772 |
| 2007/0297136 A1 | 12/2007 | Konshak | | |

(Continued)

OTHER PUBLICATIONS

French Search Report for French Application No. 1354943, dated Jan. 24, 2014.

*Primary Examiner* — Ned Landrum
*Assistant Examiner* — Filip Zec
(74) *Attorney, Agent, or Firm* — Pillsbury Winthrop Shaw Pittman LLP

(57) ABSTRACT

A cooling system for the electronic components of a computer rack, including a primary circuit of primary liquid; a primary exchanger intended to transfer heat from first electronic components to the primary liquid; a secondary circuit of refrigerant fluid; a primary-secondary exchanger; a tertiary circuit of tertiary liquid; a secondary-tertiary exchanger; and a tertiary-thermal source exchanger. The cooling system also includes a tertiary-secondary exchanger; and an air-tertiary exchanger intended to transfer, to the tertiary liquid, heat from the air of the computer rack heated by second electronic components, the air-tertiary exchanger being arranged, in the tertiary circuit, downstream of the tertiary-secondary exchanger and upstream of the secondary-tertiary exchanger.

20 Claims, 3 Drawing Sheets

(56) References Cited

U.S. PATENT DOCUMENTS

| | | |
|---|---|---|
| 2009/0188264 A1 | 7/2009 | Fair et al. |
| 2011/0154842 A1* | 6/2011 | Heydari ............. H05K 7/20836 62/259.2 |
| 2011/0247348 A1 | 10/2011 | Mashiko et al. |
| 2011/0265983 A1* | 11/2011 | Pedersen ................. F25B 41/00 165/279 |
| 2012/0120603 A1 | 5/2012 | Campbell et al. |
| 2013/0205822 A1* | 8/2013 | Heiland ............... H05K 7/2079 62/259.2 |

* cited by examiner

COOLING SYSTEM, COOLED COMPUTER SYSTEM AND COMPUTER FACILITY

This invention relates to a cooling system, a cooled computer system and a computer facility.

BACKGROUND OF THE INVENTION

The invention applies more particularly to data centers that group together an enormous amount of calculating power on a reduced surface area.

DESCRIPTION OF THE PRIOR ART

It is known to use a cooling system for the electronic components of a computer rack, of the type comprising:
- a closed circuit, referred to as primary circuit, of liquid, referred to as primary liquid,
- a primary exchanger intended to transfer heat from first electronic components to the primary liquid, with the primary exchanger comprising a heat-conducting part in contact with the primary liquid and intended to be pressed against these first electronic components,
- a closed circuit, referred to as secondary circuit, of refrigerant fluid,
- a primary-secondary exchanger intended to transfer heat from the primary liquid to the refrigerant fluid,
- a closed circuit, referred to as tertiary circuit, of liquid, referred to as tertiary liquid,
- a secondary-tertiary exchanger intended to transfer heat from the refrigerant fluid to the tertiary liquid, in such a way that the refrigerant fluid changes state at least partially, and
- a tertiary-thermal source exchanger intended to transfer heat from the tertiary liquid to a thermal source.

This known cooling system uses the direct liquid cooling (DLC) method, particularly effective for flat electronic components that give off much heat per unit surface area (qualified as highly dissipative), such as processors or memories.

However, this method has the disadvantage of not being able to be used for electric components that do not have a flat shape. Furthermore, this method is relatively costly for moderately dissipative electronic components.

It can thus be desired to provide a cooling system that makes it possible to overcome at least part of the aforementioned problems and constraints.

SUMMARY OF THE INVENTION

A cooling system of the aforementioned type is therefore proposed, characterized in that it further comprises:
- a tertiary-secondary exchanger intended to transfer heat from the tertiary liquid to the refrigerant fluid, and
- an air-tertiary exchanger intended to transfer, to the tertiary liquid, heat from the air of the computer rack heated by second electronic components, with the air-tertiary exchanger being arranged, in the tertiary circuit, downstream of the tertiary-secondary exchanger and upstream of the secondary-tertiary exchanger.

As a result, thanks to a system according to the invention, it is possible to efficiently cool electronic components of varied types, in particular low dissipative components or with a non-flat shape in addition to dissipative and flat components such as processors and memories.

Optionally, the secondary circuit comprises first and second loops which both pass in the secondary-tertiary exchanger and which have a common portion, wherein the first loop bypasses the tertiary-secondary exchanger and the second loop bypasses the primary-secondary exchanger, the primary-secondary exchanger is arranged in the first loop and the tertiary-secondary exchanger is arranged in the second loop.

Also optionally, the secondary circuit comprises a flow controller of the refrigerant fluid circulating in the first and second loops, arranged in the portion common to the first and second loops.

Also optionally, the flow controller is intended to favor the flow rate in the first loop as compared to the flow rate in the second loop in order to adjust the temperature of the first electronic components.

Also optionally, the tertiary circuit comprises first and second loops which both pass in the secondary-tertiary exchanger, the first loop bypasses the tertiary-secondary exchanger and the air-tertiary exchanger, and the tertiary-secondary exchanger and the air-tertiary exchanger are arranged in the second loop.

Also optionally, the cooling system further comprises a primary-tertiary exchanger intended to transfer heat from the primary liquid to the tertiary liquid.

Also optionally, the tertiary circuit comprises a third loop that bypasses the tertiary-secondary exchanger and the secondary-tertiary exchanger, and that passes into the tertiary-thermal source exchanger, and the primary-tertiary exchanger is arranged in the third loop.

Also optionally, the cooling system further comprises a pressure regulator intended to adjust the pressure of the refrigerant fluid according to the temperature of the tertiary liquid.

A cooled computer system is also proposed comprising: a computer rack that encloses electronic components; and a cooling system for the electronic components of the computer rack such as defined hereinabove; and wherein the air-tertiary exchanger is arranged in a rear face of the computer rack through which air is intended to exit the computer rack.

Optionally, the computer rack comprises a ventilation system in order to favor the exiting of the air through the rear face, through the air-tertiary exchanger.

A computer facility is also proposed comprising: a cooled computer system such as defined hereinabove, a computer room wherein the computer rack is arranged; and a service rack arranged in the computer room and which encloses at least one portion of the elements of the cooling system.

BRIEF DESCRIPTION OF THE DRAWINGS

The invention shall be better understood using the following description, provided solely by way of example and made in reference to the annexed drawings wherein.

DESCRIPTION OF THE PREFERRED EMBODIMENTS

Figure 1:
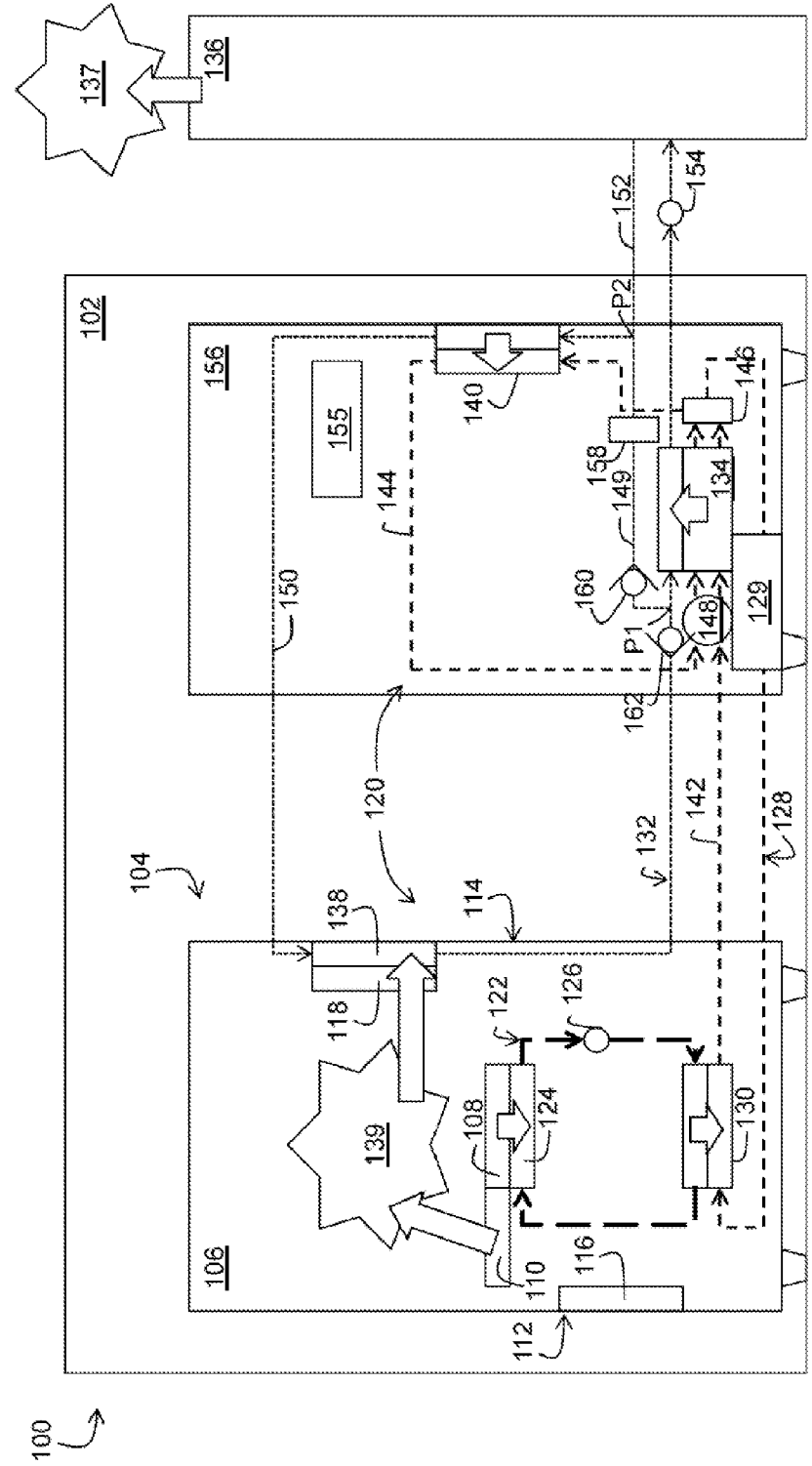
FIG. 1 diagrammatically shows the general structure of a computer facility, according to a first embodiment of the invention, FIG. 2 diagrammatically shows the general structure of a computer facility, according to a second embodiment of the invention, and FIG. 3 diagrammatically shows the general structure of a computer facility, according to a third embodiment of the invention.

In the figures, the thick arrows show the heat transfers. Furthermore, the control components and the non-return valves are not shown.

In reference to FIG. 1, a computer facility 100 according to a first embodiment of the invention shall now be described.

The computer facility 100 first comprises a computer room 102.

The computer facility 100 further comprises a cooled computer system 104.

The cooled computer system 104 comprises firstly a computer rack 106 arranged in the computer room 102, and which encloses electronic components 108, 110. The electronic components 108, 110 group together two types of electronic components.

The electronic components 108 of the first type generate a substantial amount of heat per unit surface area, for example between 50 and 100 W/cm$^2$. They are qualified as "highly dissipative". These are generally highly-integrated electronic components and/or with very fast interfaces. The electronic components 108 are for example high-performance microprocessors. The electronic components 108 are furthermore generally flat.

The electronic components 110 of the second type generate less heat per unit surface area, for example between 0.5 and 1 W/cm$^2$. They are qualified as "little or moderately dissipative". The electronic components 110 are furthermore generally of varied non-flat shapes. The electronic components 110 are for example dual in-line memory modules, switch-mode power supply converters, or linear power supplies.

The computer rack 106 has a front face 112 through which air is intended to enter and a rear face 114 through which the air is intended to exit. The computer rack 106 further encloses a front ventilation system 116 intended to favor the entry of air through the front face 112 and a rear ventilation system 118 intended to favor the exiting of air through the rear face 114, in such a way that the ventilation systems 116, 118 generate a flow of air at normal pressure, i.e. 1 atm at 20° C.

The cooled computer system 104 further comprises a system 120 for cooling electronic components 108, 110.

The cooling system 120 comprises firstly a first closed circuit 122 of liquid. The circuit 122 shall be referred to in what follows as primary circuit 122, and the liquid shall be referred to in what follows as primary liquid. The primary liquid is for example water or a water-antifreeze mixture. The primary liquid remains in the liquid state all along the primary circuit 122. The primary circuit 122 has a loop, unique in the example described, wherein a primary exchanger 124 is arranged so as to transfer the heat from the electronic components 108 to the primary liquid. To this effect, the primary exchanger 124 is more preferably an exchanger of the cold plate type comprising at least one block, for example made of aluminum, inside of which the primary liquid circulates, with the block being pushed directly against the electronic components 108. The pushing is all the more so effective as the electronic components 108 are flat.

The primary circuit 122 further comprises a pump 126 arranged in the loop and intended to circulate the primary liquid in the primary circuit 122. The pump 126 is located downstream of the primary exchanger 124, and can be, as selected, with a constant or variable speed.

The cooling system 120 further comprises a second closed circuit 128 of fluid. The circuit 128 shall be referred to in what follows as secondary circuit 128. The fluid is a refrigerant fluid intended, as shall be explained in what follows, to change state when it circulates in the secondary circuit 128. The refrigerant fluid is for example carbon dioxide (industrial nomenclature R744). In the example described, the refrigerant fluid circulates in the secondary circuit 128 under a pressure varying around an average pressure, for example of a magnitude of 65 atm according to its position along the secondary circuit 128. Preferably, the secondary circuit 128 comprises a pressure regulator 129 intended to adjust the average pressure of the refrigerant fluid, for example between 50 and 70 atm.

The cooling system 120 further comprises a primary-secondary exchanger 130 intended to transfer heat from the primary liquid to the refrigerant fluid. The refrigerant fluid enters into the primary-secondary exchanger 130 in liquid form, wherein it is subjected to a drop in pressure and a passage, at least partial, in gaseous form. The change of state from a liquid to a gas allows for the absorption of a substantial quantity of heat, referred to as latent heat of evaporation.

The cooling system 120 further comprises a third closed circuit 132 of liquid. The circuit 132 shall be referred to in what follows as tertiary circuit 132, and the liquid shall be referred to in what follows as tertiary liquid. The tertiary liquid is for example water. The tertiary liquid remains in the liquid state all along the tertiary circuit 132.

The cooling system 120 further comprises a secondary-tertiary exchanger 134 intended to transfer heat from the refrigerant fluid to the tertiary liquid. During this transfer of heat, the refrigerant fluid changes, at least partially, state. For example, the secondary-tertiary exchanger 134 is a condenser wherein the refrigerant fluid enters in gaseous form (when it exits from a compressor 148 which shall be described in more detail further on) and wherein the temperature of the refrigerant fluid is lowered in such a way that at least one portion of the refrigerant fluid passes in liquid form. The secondary-tertiary exchanger 134 furthermore functions as a liquid/gaseous phase separator of the refrigerant fluid, in order to prevent refrigerant fluid in gaseous form from being introduced again into the secondary circuit 128.

The cooling system 120 further comprises a tertiary-thermal source exchanger 136 intended to transfer heat from the tertiary liquid to a thermal source 137 with a quasi-infinite capacity, such as the atmosphere, a river or a lake. For example the tertiary-thermal source exchanger 136 is an air cooler intended to transfer heat from the tertiary liquid to the atmosphere. The air cooler forces the outside air through exchange surfaces in order to bring the temperature of the tertiary liquid to a value close to the temperature of the thermal source 137, i.e. in this case with the outside ambient temperature. The tertiary-thermal source exchanger 136 is more preferably located outside the computer room 102. The tertiary liquid enters into the tertiary-thermal source exchanger 136 with a temperature generally 20° C. higher than its temperature at the output of the tertiary-thermal source exchanger 136.

As such, the heat is evacuated from the electronic components 108 to the thermal source 137 by the following first heat evacuation path: primary exchanger 124, primary circuit 122, primary-secondary exchanger 130, secondary circuit 128, secondary-tertiary exchanger 134, tertiary circuit 132 (in the example described, a loop 149 of this tertiary circuit 132, which shall be described in more detail further on) and tertiary-thermal source exchanger 136.

To evacuate the heat from the electronic components 110, the cooling system 120 further defines a second heat evacuation path, which shall now be described.

The cooling system 120 comprises an air-tertiary exchanger 138 intended to transfer, to the tertiary liquid, heat from the air 139 of the computer rack 106, with this air 139 having been heated by the electronic components 110 and, to a lesser degree, by the electronic components 108. In order to favor the transfer of heat, the rear ventilation system 118 directs the air 139 to the air-tertiary exchanger 138. As such, the heat of the air 139 of the computer rack 106 is not evacuated in the computer room 102, which makes it possible to use air conditioners of reduced size, and therefore less expensive, to air condition the computer room 102.

As such, the heat is evacuated from the electronic components 110 to the thermal source 137 by the following second heat evacuation path: air 139 from the computer rack 106, air-tertiary exchanger 138, tertiary circuit 132 and tertiary-thermal source exchanger 136.

As indicated hereinabove, the tertiary liquid exits from the tertiary-thermal source exchanger 136 at a temperature close to that of the thermal source 137. However, this temperature is generally relative high, for example around 20° C. when the thermal source 137 is the atmosphere. In order to improve the effectiveness of the air-tertiary exchanger 138, it is therefore preferable to lower the temperature of the tertiary liquid before it enters the air-tertiary exchanger 138. To this effect, the cooling system 120 further comprises a tertiary-secondary exchanger 140 placed in the tertiary circuit 132 upstream of the air-tertiary exchanger 138 and downstream of the secondary-tertiary exchanger 134. The tertiary-secondary exchanger 140 is intended to transfer heat from the tertiary liquid to the refrigerant fluid. The latter then enters into the tertiary-secondary exchanger 140 in liquid form, wherein it is subjected to a drop in pressure and a passage, at least partial, in gaseous form. The change of state from a liquid to a gas allows for the absorption of a substantial quantity of heat, referred to as latent heat of evaporation. As such, the tertiary liquid arrives cooled in the air-tertiary exchanger 138, which favors the transfer of heat from the air 139 from the computer rack 106 to the tertiary liquid.

So that the two heat evacuation paths of the electronic components 108, 110 do not disturb one another, the secondary 128 and tertiary 132 circuits have loops dedicated to each of these paths, with certain elements merged in order to reduce the cost and the encumbrance of the cooling system 120. These loops shall now be described.

The secondary circuit 128 comprises first and second loops 142, 144 having a common portion through which the first and second loops 142, 144 communicate. In the example described, the secondary circuit 128 comprises a flow controller 146 forming this common portion and intended to adjust the relative flow rate in each of the two loops 142, 144. It is as such possible to favor one or the other of the heat evacuation paths. The heat regulation of the components 108 generally has priority over that for the electronic components 110, which therefore leads to favoring the first heat evacuation path. As such, the flow controller 146 is more preferably configured to adjust the temperature of the primary liquid to a predetermined setting, by increasing the flow rate in the first loop 142 to the detriment of the flow rate in the second loop 144.

The secondary circuit 128 further comprises a compressor 148 intended to put the refrigerant fluid into circulation in the secondary circuit 128 and to bring the refrigerant fluid to a nominal pressure for the secondary-tertiary exchanger 134. The refrigerant fluid enters into the compressor 148 in gaseous form and exits in liquid/gaseous form from the compressor 148. The compressor 148, associated with a pressure accumulator (not shown), also makes it possible to compensate the losses of pressure due to micro-leaks in the secondary circuit 128 and/or pressure fluctuations due to a cooling or a heating of the secondary circuit 128 according to the temperature of the computer room 102. The compressor 148 is located upstream of the secondary-tertiary exchanger 134. The compressor 148 is for example a twin-body turbocompressor.

The first and second loops 142, 144 pass in the compressor 148, as well as in the secondary-tertiary exchanger 134 so that the refrigerant fluid that is circulating therein loses heat to the benefit of the tertiary liquid.

The first loop 142 bypasses the tertiary-secondary exchanger 140 and comprises the primary-secondary exchanger 130, while the second loop 144 bypasses the primary-secondary exchanger 130 and comprises the tertiary-secondary exchanger 140.

Moreover, the tertiary circuit 132 comprises first and second loops 149, 150 both passing in the secondary-tertiary exchanger 134 and having a common portion 152 (from point P1 to point P2 by passing through the tertiary-thermal source exchanger 136). The common portion 152 comprises the secondary-tertiary exchanger 134, a pump 154 and the tertiary-thermal source exchanger 136. The pump 154 is intended to put the tertiary liquid into circulation in the tertiary circuit 132 to the tertiary-thermal source exchanger 136. The first loop 149 bypasses the tertiary-secondary exchanger 140 and the air-tertiary exchanger 138 in order to directly connect the tertiary-thermal source exchanger 136 to the secondary-tertiary exchanger 134. As such, the first loop 149 belongs to the first heat evacuation path of the electronic components 108.

The second loop 150 comprises the tertiary-secondary exchanger 140 and the air-tertiary exchanger 138. As such, the second loop 150 belongs to the second heat evacuation path of the electronic components 110.

The cooling system 120 optionally comprises short-circuit valves (not shown) arranged in parallel of respectively the primary-secondary exchanger 130, the air-tertiary exchanger 138 and the tertiary-secondary exchanger 140, in order to adjust the heat transfers carried out by these exchangers.

The cooling system 120 further comprises means for controlling 155 intended to control the speed of the compressor 148, and of the pumps 126, 154, according to the temperature of the electronic components 108, 110, in order to keep this temperature within the acceptable limits for the electronic components 108, 110.

The cooled computer system 104 further comprises a service rack 156 arranged in the computer room 102 and which encloses the compressor 148, the secondary-tertiary exchanger 134, the flow controller 146 and the tertiary-secondary exchanger 140. Using the service rack 156 makes it possible to acoustically isolate the elements of the cooling system 120 and in particular the compressor 148. This acoustic isolation can be further improved by adding a cover to the compressor 148. Using the service rack 156 makes it possible to reduce the distances between electronic components, since the elements grouped together in the service rack are no longer taking up space in the computer rack 106.

There may be several computer racks 106 for a single service rack 156.

Preferably, controlled valves and non-return valves are used in the circuits of the computer facility 100.

For example, in the example of FIG. 1, a solenoid valve 158 is arranged in the first loop 149 of the tertiary circuit 132, between the point P2 and the point P1. Furthermore, a non-return valve 160 is arranged in the first loop 149 of the tertiary circuit 132, in order to prevent the tertiary fluid from circulating from the point P1 to the point P2. Furthermore, a non-return valve 162 is arranged in the loop 150 of the tertiary circuit 132, in order to prevent the tertiary fluid from circulating from the point P1 to the air-tertiary exchanger 138.

The computer facility 100 described hereinabove makes it possible for example to evacuate power of a magnitude of 150 kW for a computer rack 106 with dimensions 60 cm×90 cm×200 cm, commonly used in computer rooms. A computer room comprising 150 computer racks cooled by cooling systems such as the cooling system 120 is then able to constantly evacuate power over 20 MW. It is therefore possible to house more calculating power in the limited surface area of air conditioned computer rooms.

Preferably, the instantaneous pressure of the refrigerant fluid varies little, for example by more or less 0.5 atm around the average pressure (65 atm in the example described hereinabove), in order to minimize losses due to the turbocompressor 148. The average pressure depends on the temperature of the tertiary fluid. For example, for a tertiary fluid temperature of 25° C., the optimum average pressure (for the operation of the turbocompressor) of the refrigerant fluid is 65 atm. Preferably, the pressure regulator 129 adjusts the average pressure according to the tertiary fluid temperature. As such, when the operating temperature of the tertiary fluid must follow the constraints in the change of the outside temperature, the pressure regulator 129 changes the average pressure of the secondary circuit in order to minimize the consumption of electricity, for example between 50 and 70 atm.

If a fraction of the liquid subsists at the output of an evaporator 130, 140, it is trapped by gravity in a reservoir of liquid, referred to as separator, which may or may not be a part of the evaporator.

Figure 2:
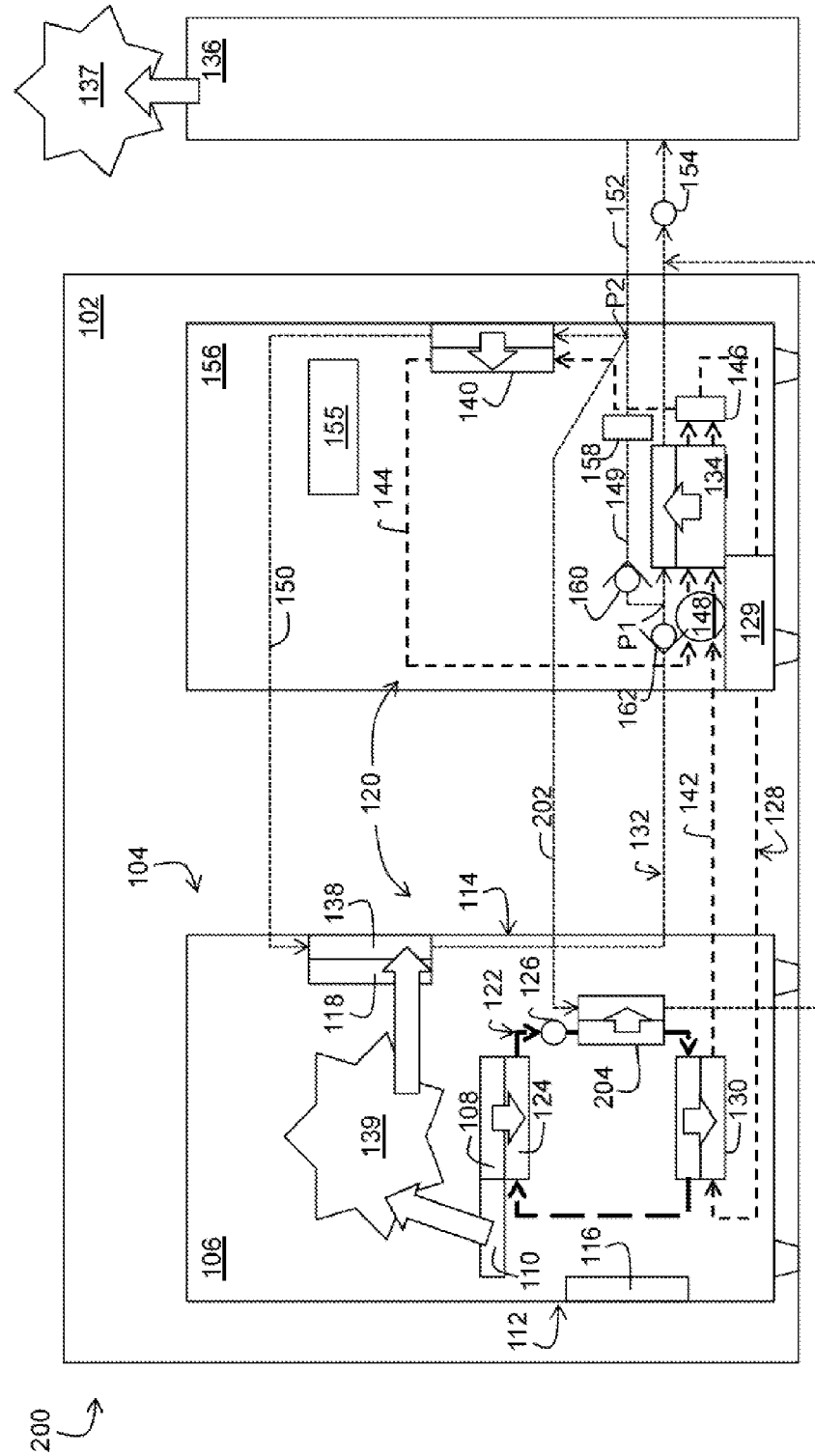

With reference to FIG. 2, a computer facility 200 according to a second embodiment of the invention shall now be described.

The computer facility 200 is identical to that of FIG. 1, except that the tertiary circuit 132 comprises a third loop 202 that joins the common portion 152 of the first and second loops 149, 150 upstream of the pump 154 and that exits this common portion 152 downstream of the tertiary-thermal source exchanger 136. Because of this, the third loop 202 passes through the pump 154 and the tertiary-thermal source exchanger 136, and bypasses the air-tertiary exchanger 138, the tertiary-secondary exchanger 140 and the secondary-tertiary exchanger 134. Preferably, the loop 202 passes through a raised floor of the room 102. The reason is due to the relative substantial diameter (4 to 6 cm) of the pipes of the loop 202.

Furthermore, the cooling system 120 comprises, arranged in the third loop 202, a primary-tertiary exchanger 204 intended to transfer heat from the primary liquid to the tertiary liquid. The primary-tertiary exchanger 204 is for example a plate exchanger.

As such, the heat is evacuated from the electronic components 108 to the thermal source 137 by the following third heat evacuation path: primary exchanger 124, primary circuit 122, primary-tertiary exchanger 204, tertiary circuit 132 and tertiary-thermal source exchanger 136.

The presence of a heat transfer from the primary liquid to the tertiary liquid allows for a smaller dimensioning of the elements of the first and second heat evacuation paths since less heat is evacuated by these two paths. In particular, the electrical consumption of the compressor 148 is reduced.

The energy efficiency of the cooling system 120 is based in particular on adjusting the pressure of the secondary fluid at the output of the flow controller 146, such that the compressor 143 only has to provide a minimum of energy to allow for the change of state of the refrigerant fluid, while still providing a substantial flow rate in the secondary circuit 128. This flow rate is indeed responsible for quantities of heat that can be extracted from the primary circuit 122.

Moreover, the temperature difference between the temperature of the secondary fluid at the output of the primary-secondary exchanger 130 and the temperature of the tertiary liquid at the entrance of the secondary-tertiary exchanger 134 is adjusted around a value that is as low as possible in order to maximize the energy efficiency defined by power of the heat transfer in the secondary-tertiary exchanger 134 in relation to the power supplied to the compressor 148.

Moreover, the exact value of the pressure of the refrigerant fluid depends in particular on the temperature of the tertiary liquid, but is maintained by suitable regulation at a value at which the compressor 148 consumes the least electricity possible.

The temperature of the tertiary liquid at the entrance to the air-tertiary exchanger 138 is adjusted in such a way that the power radiated and/or dissipated by natural convection to be evacuated in the air of the computer room 102 (for example of a magnitude of 5 kW) is compensated by the absorption of power in the air-tertiary exchanger 138. Note that, during the winter, when the return temperatures of the tertiary liquid are very low (as the temperature of the thermal source 137 is very low), the air 139 can be used as heating for the computer room 102 by more or less short circuiting the air-tertiary exchanger 138.

Optionally, in FIG. 2, the circuit 132 can be made independent of the circuit 152 and constitute a fourth cooling loop if a circulation pump is inserted therein. This circuit can then transport a liquid different from that of the loop 152, for example a dielectric liquid making it possible to limit the electric risks in case of leakage. This loop can then be used in direct liquid cooling (DLC) mode, as with the circuit 122, but in contact with components that have a potential danger (high voltage, etc.). Optionally, in this latter case, it is possible to suppress the circuit 144 and to evacuate the heat introduced in 138 to the tertiary liquid via an exchanger 204 with a triple hydraulic circuit.

Figure 3:
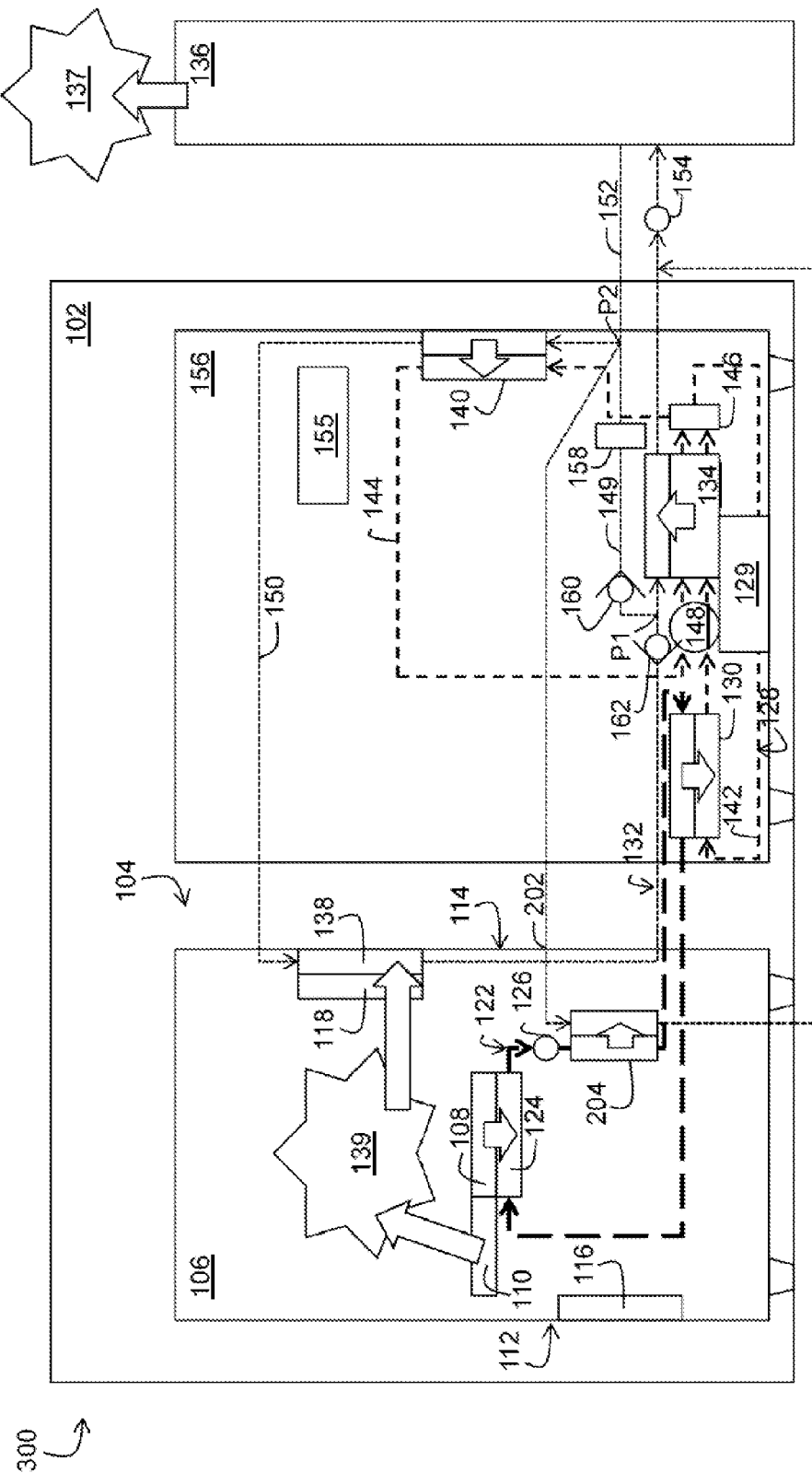

With reference to FIG. 3, a computer facility 300 according to a third embodiment of the invention shall now be described.

This computer facility 300 is identical to that of FIG. 1, except that the exchanger 130 is located in the rack 156 instead of in the rack 106.

It clearly appears that a computer facility such as one of hose described hereinabove makes it possible to cool varied types of electronic components.

Furthermore, using refrigerant fluid under high pressure (50 bars) in a separated circuit, of which a portion is located in the rack 156, makes it possible to prevent this refrigerant fluid from penetrating into the electronic chassis components which require disassembly, in such a way that a quasi-perfect seal can be obtained.

Moreover, processors increasingly have optimized energy consumption profiles in order to take advantage of the thermal inertia of the packages and of the heat dissipaters which are in contact with them. For example, for a few seconds, a processor for which the thermal design point or TDP is equal to 130 W will be able to consume 160 to 200 W on the electric power supplies of its motherboard with the hypothesis that the heat peak is not going to be repeated too often and will be able to be integrated by the cooling system. If this hypothesis does not hold, the temperature of its silicon increases and in this case the processor reduces its clock frequency end/or its supply voltage in order to allow the temperature to fall back down without affecting the reliability of the operation. A consequence of this behavior is that, if it is desired to avoid a loss in performance, the cooling system must be able to provide peak heat evacuation. However, in the cooling system 120, the secondary circuit 128 and its compressor 148 make it possible, via a peak electrical consumption of a few seconds of the motor of the compressor 148, to provide this peak heat evacuation and to stabilize the temperature of the primary fluid without waiting for the regulation response of the tertiary circuit (which is very powerful but has great inertia).

Note moreover that the invention is not limited to the embodiments described hereinabove. It shall appear indeed to those skilled in the art that various modifications can be made to the embodiments described hereinabove, in light of the information that has just been disclosed.

For example, it is possible to use a local closed loop for the air of the rack 106, in such a way that the air of the computer room 102 and that 139 of the computer rack 106 do not communicate. This solution can be useful if the air of the room is highly polluted (fog, saline, fumes, etc.).

Moreover, the common portion of the loops 142, 144 of the secondary circuit 128 can be larger and comprise, in addition to the flow controller 146, the secondary-tertiary exchanger 134.

In the following claims, the terms used must not be interpreted as limiting the claims to the embodiments exposed in this description, but must be interpreted to include therein all of the equivalents that the claims aim to cover due to their formulation and of which the vision is within the scope of those skilled in the art by applying their general knowledge to the implementation that has just been disclosed.

Moreover, the rack 156 may be, indeed, a booster (a sort of small auxiliary rack from 30 to 35 cm in height) fastened to the top of the basic rack 106.

The invention claimed is:

1. A cooling system for electronic components of a computer rack, comprising:
    a closed circuit, referred to as a primary circuit, of liquid, referred to as primary liquid;
    a primary exchanger which transfers heat from a plurality of first electronic components to the primary liquid, the primary exchanger further comprising a heat-conducting part provided in contact with the primary liquid and adapted to be pressed against said plurality of first electronic components;
    a closed circuit, referred to as secondary circuit, of refrigerant fluid;
    a primary-secondary exchanger which transfers heat from the primary liquid to the refrigerant fluid;
    a closed circuit, referred to as tertiary circuit, of liquid, referred to as tertiary liquid;
    a secondary-tertiary exchanger which transfers heat from the refrigerant fluid to the tertiary liquid, such that the refrigerant fluid changes state at least partially;
    a tertiary-thermal source exchanger which transfers heat from the tertiary liquid to a thermal source,
    a tertiary-secondary exchanger which transfers heat from the tertiary liquid to the refrigerant fluid; and
    an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger,
    wherein the secondary circuit comprises first and second loops both passing in the secondary-tertiary exchanger and having a common portion, wherein the first loop bypasses the tertiary-secondary exchanger and the second loop bypasses the primary-secondary exchanger, and wherein the primary-secondary exchanger is arranged in the first loop and the tertiary-secondary exchanger is arranged in the second loop.

2. The cooling system as claimed in claim 1, wherein the secondary circuit comprises a flow controller of the refrigerant fluid circulating in the first and second loops, arranged in the portion common to the first and second loops.

3. The cooling system as claimed in claim 2, wherein the flow controller adjusts a flow rate in the first loop as compared to a flow rate in the second loop in order to adjust the temperature of the plurality of first electronic components.

4. The cooling system as claimed in claim 1, further comprising:
    a primary-tertiary exchanger which transfers heat from the primary liquid to the tertiary liquid.

5. The cooling system as claimed in claim 4, wherein the tertiary circuit comprises a third loop that bypasses the tertiary-secondary exchanger and the secondary-tertiary exchanger, and that passes into the tertiary-thermal source exchanger, and wherein the primary-tertiary exchanger is arranged in the third loop.

6. The cooling system as claimed in claim 1, further comprising a pressure regulator which adjusts a pressure of the refrigerant fluid according to a temperature of the tertiary liquid.

7. A cooling system for electronic components of a computer rack, comprising:
    a closed circuit, referred to as a primary circuit, of liquid, referred to as primary liquid;
    a primary exchanger which transfers heat from a plurality of first electronic components to the primary liquid, the primary exchanger further comprising a heat-conducting part provided in contact with the primary liquid and adapted to be pressed against said plurality of first electronic components;
    a closed circuit, referred to as secondary circuit, of refrigerant fluid;
    a primary-secondary exchanger which transfers heat from the primary liquid to the refrigerant fluid;
    a closed circuit, referred to as tertiary circuit, of liquid, referred to as tertiary liquid;
    a secondary-tertiary exchanger which transfers heat from the refrigerant fluid to the tertiary liquid, such that the refrigerant fluid changes state at least partially;
    a tertiary-thermal source exchanger which transfers heat from the tertiary liquid to a thermal source,
    a tertiary-secondary exchanger which transfers heat from the tertiary liquid to the refrigerant fluid; and
    an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger, wherein the tertiary circuit comprises first and second loops both passing in the secondary-tertiary exchanger, wherein the first loop bypasses the tertiary-secondary exchanger and the air-tertiary exchanger, and wherein the tertiary-secondary exchanger and the air-tertiary exchanger are arranged in the second loop.

8. A computer facility comprising:
a cooled computer system, comprising
    a computer rack enclosing a plurality of electronic components, and
    a cooling system for the plurality of electronic components of the computer rack, said cooling system comprising
        a closed circuit, referred to as a primary circuit, of liquid, referred to as primary liquid;
        a primary exchanger which transfers heat from the plurality of electronic components to the primary liquid, the primary exchanger further comprising a heat-conducting part provided in contact with the primary liquid and adapted to be pressed against said plurality of electronic components;
        a closed circuit, referred to as secondary circuit, of refrigerant fluid;
        a primary-secondary exchanger which transfers heat from the primary liquid to the refrigerant fluid;
        a closed circuit, referred to as tertiary circuit, of liquid, referred to as tertiary liquid;
        a secondary-tertiary exchanger which transfers heat from the refrigerant fluid to the tertiary liquid, such that the refrigerant fluid changes state at least partially;
        a tertiary-thermal source exchanger which transfers heat from the tertiary liquid to a thermal source,
        a tertiary-secondary exchanger which transfers heat from the tertiary liquid to the refrigerant fluid; and
        an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger, and
        wherein the air-tertiary exchanger is arranged in a rear face of the computer rack constructed to allow air to exit the computer rack,
    a computer room wherein the computer rack is arranged, and
    a service rack arranged in the computer room and enclosing at least one portion of elements of the cooling system,
    wherein the secondary circuit comprises first and second loops both passing in the secondary-tertiary exchanger and having a common portion, wherein the first loop bypasses the tertiary-secondary exchanger and the second loop bypasses the primary-secondary exchanger, and wherein the primary-secondary exchanger is arranged in the first loop and the tertiary-secondary exchanger is arranged in the second loop.

9. The computer facility as claimed in claim 8, wherein the secondary circuit comprises a flow controller of the refrigerant fluid circulating in the first and second loops, arranged in the portion common to the first and second loops.

10. The computer facility as claimed in claim 9, wherein the flow controller adjusts a flow rate in the first loop as compared to a flow rate in the second loop in order to adjust the temperature of the plurality of electronic components.

11. The computer facility as claimed in claim 8, wherein the cooling system further comprises a primary-tertiary exchanger which transfers heat from the primary liquid to the tertiary liquid,
wherein the tertiary circuit comprises a third loop that bypasses the tertiary-secondary exchanger and the secondary-tertiary exchanger, and that passes into the tertiary-thermal source exchanger, and wherein the primary-tertiary exchanger is arranged in the third loop.

12. The computer facility as claimed in claim 8, wherein the cooling system further comprises a pressure regulator which adjusts a pressure of the refrigerant fluid according to a temperature of the tertiary liquid.

13. A computer facility comprising:
a cooled computer system, comprising
    a computer rack enclosing a plurality of electronic components, and
    a cooling system for the plurality of electronic components of the computer rack, said cooling system comprising
        a closed circuit, referred to as a primary circuit, of liquid, referred to as primary liquid;
        a primary exchanger which transfers heat from the plurality of electronic components to the primary liquid, the primary exchanger further comprising a heat-conducting part provided in contact with the primary liquid and adapted to be pressed against said plurality of electronic components;
        a closed circuit, referred to as secondary circuit, of refrigerant fluid;
        a primary-secondary exchanger which transfers heat from the primary liquid to the refrigerant fluid;
        a closed circuit, referred to as tertiary circuit, of liquid, referred to as tertiary liquid;
        a secondary-tertiary exchanger which transfers heat from the refrigerant fluid to the tertiary liquid, such that the refrigerant fluid changes state at least partially;
        a tertiary-thermal source exchanger which transfers heat from the tertiary liquid to a thermal source,
        a tertiary-secondary exchanger which transfers heat from the tertiary liquid to the refrigerant fluid; and
        an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger, and
        wherein the air-tertiary exchanger is arranged in a rear face of the computer rack constructed to allow air to exit the computer rack,
    a computer room wherein the computer rack is arranged, and
    a service rack arranged in the computer room and enclosing at least one portion of elements of the cooling system,
    wherein the tertiary circuit comprises first and second loops both passing in the secondary-tertiary exchanger, wherein the first loop bypasses the tertiary-secondary exchanger and the air-tertiary exchanger, and wherein the tertiary-secondary exchanger and the air-tertiary exchanger are arranged in the second loop.

14. A cooled computer system comprising:
a computer rack enclosing a plurality of electronic components, and a cooling system for the plurality of electronic components of the computer rack, said cooling system comprising
a closed circuit, referred to as a primary circuit, of liquid, referred to as primary liquid;
a primary exchanger which transfers heat from the plurality of electronic components to the primary liquid, the primary exchanger further comprising a heat-conducting part provided in contact with the primary liquid and adapted to be pressed against said plurality of electronic components;
a closed circuit, referred to as secondary circuit, of refrigerant fluid;
a primary-secondary exchanger which transfers heat from the primary liquid to the refrigerant fluid;
a closed circuit, referred to as tertiary circuit, of liquid, referred to as tertiary liquid;
a secondary-tertiary exchanger which transfers heat from the refrigerant fluid to the tertiary liquid, such that the refrigerant fluid changes state at least partially;
a tertiary-thermal source exchanger which transfers heat from the tertiary liquid to a thermal source,
a tertiary-secondary exchanger which transfers heat from the tertiary liquid to the refrigerant fluid; and
an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger, and
wherein the air-tertiary exchanger is arranged in a rear face of the computer rack constructed to allow air to exit the computer rack,
wherein the secondary circuit comprises first and second loops both passing in the secondary-tertiary exchanger and having a common portion, wherein the first loop bypasses the tertiary-secondary exchanger and the second loop bypasses the primary-secondary exchanger, and wherein the primary-secondary exchanger is arranged in the first loop and the tertiary-secondary exchanger is arranged in the second loop.

15. The cooled computer system as claimed in claim 14, wherein the computer rack comprises a ventilation system constructed to cause a flow of air through the rear face, through the air-tertiary exchanger.

16. The cooled computer system as claimed in claim 14, wherein the secondary circuit comprises a flow controller of the refrigerant fluid circulating in the first and second loops, arranged in the portion common to the first and second loops.

17. The cooled computer system as claimed in claim 16, wherein the flow controller adjusts a flow rate in the first loop as compared to a flow rate in the second loop in order to adjust the temperature of the plurality of electronic components.

18. The cooled computer system as claimed in claim 14, wherein the cooling system further comprises a primary-tertiary exchanger which transfers heat from the primary liquid to the tertiary liquid,
wherein the tertiary circuit comprises a third loop that bypasses the tertiary-secondary exchanger and the secondary-tertiary exchanger, and that passes into the tertiary-thermal source exchanger, and wherein the primary-tertiary exchanger is arranged in the third loop.

19. The cooled computer system as claimed in claim 14, wherein the cooling system further comprises a pressure regulator which adjusts a pressure of the refrigerant fluid according to a temperature of the tertiary liquid.

20. A cooled computer system comprising:
a computer rack enclosing a plurality of electronic components, and
a cooling system for the plurality of electronic components of the computer rack, said cooling system comprising
a closed circuit, referred to as a primary circuit, of liquid, referred to as primary liquid;
a primary exchanger which transfers heat from the plurality of electronic components to the primary liquid, the primary exchanger further comprising a heat-conducting part provided in contact with the primary liquid and adapted to be pressed against said plurality of electronic components;
a closed circuit, referred to as secondary circuit, of refrigerant fluid;
a primary-secondary exchanger which transfers heat from the primary liquid to the refrigerant fluid;
a closed circuit, referred to as tertiary circuit, of liquid, referred to as tertiary liquid;
a secondary-tertiary exchanger which transfers heat from the refrigerant fluid to the tertiary liquid, such that the refrigerant fluid changes state at least partially;
a tertiary-thermal source exchanger which transfers heat from the tertiary liquid to a thermal source,
a tertiary-secondary exchanger which transfers heat from the tertiary liquid to the refrigerant fluid; and
an air-tertiary exchanger which transfers, to the tertiary liquid, heat from air heated by second electronic components, said air-tertiary exchanger being arranged, in the tertiary circuit, downstream of the tertiary-secondary exchanger and upstream of the secondary-tertiary exchanger, and
wherein the air-tertiary exchanger is arranged in a rear face of the computer rack constructed to allow air to exit the computer rack,
wherein the tertiary circuit comprises first and second loops both passing in the secondary-tertiary exchanger, wherein the first loop bypasses the tertiary-secondary exchanger and the air-tertiary exchanger, and wherein the tertiary-secondary exchanger and the air-tertiary exchanger are arranged in the second loop.

\* \* \* \* \*